(12) United States Patent
Hase et al.

(10) Patent No.: US 7,101,455 B1
(45) Date of Patent: Sep. 5, 2006

(54) METHOD AND DEVICE FOR MANUFACTURING LAMINATED PLATE

(75) Inventors: Naoki Hase, Shiga (JP); Kosuke Kataoka, Shiga (JP); Hiroyuki Furutani, Osaka (JP); Yasuo Fushiki, Kyoto (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 10/129,037

(22) PCT Filed: Oct. 30, 2000

(86) PCT No.: PCT/JP00/07656

§ 371 (c)(1),
(2), (4) Date: Apr. 30, 2002

(87) PCT Pub. No.: WO01/32418

PCT Pub. Date: May 10, 2001

(30) Foreign Application Priority Data

| | | |
|---|---|---|
| Nov. 1, 1999 | (JP) | ................................. 11/310720 |
| Apr. 27, 2000 | (JP) | ............................. 2000-126942 |
| Apr. 27, 2000 | (JP) | ............................. 2000-126943 |
| Aug. 11, 2000 | (JP) | ............................. 2000-244905 |
| Aug. 18, 2000 | (JP) | ............................. 2000-248795 |
| Aug. 18, 2000 | (JP) | ............................. 2000-248796 |
| Sep. 21, 2000 | (JP) | ............................. 2000-287552 |

(51) Int. Cl.
*B32B 37/04* (2006.01)
*B32B 37/06* (2006.01)
*B32B 37/08* (2006.01)
*B32B 37/12* (2006.01)
*B32B 37/20* (2006.01)
*B32B 38/10* (2006.01)

(52) U.S. Cl. ................ 156/247; 156/306.6; 156/308.2; 156/311; 156/322; 156/324; 156/327

(58) Field of Classification Search ................ 156/289, 156/182, 306.6, 308.2, 311, 323, 325, 324, 156/537, 583.5
See application file for complete search history.

(56) References Cited

U.S. PATENT DOCUMENTS 5,112,425 A * 5/1992 Besso .......................... 156/247

(Continued)

FOREIGN PATENT DOCUMENTS

JP 62-13336 A 1/1987

(Continued)

*Primary Examiner*—Melvin Mayes
(74) *Attorney, Agent, or Firm*—Brinks Hofer Gilson & Lione

(57) ABSTRACT

The present invention provides a method for producing a laminate suitable for a flexible circuit board which is free from visual defects such as wrinkles and curls that appear when a plurality of laminating materials containing a thermally fusible laminating material are formed by thermally laminating these materials each other using a thermal-press forming device, which comprises the steps of: arranging a heat resistant protective material between a pressing surface and the laminating materials, laminating the materials by thermal pressure at not lower than 200° C., wherein the bonded laminating materials are in contact with the protective material, cooling the bonded laminating materials, and peeling off the protective material from the bonded laminating materials, whereby the laminate with less nonuniformity in pressurization, a uniform surface, and a good interlayer adhesion, and the method and device for producing the laminate can be provided, more particularly, the thermal pressure and forming is performed by a thermal-press forming device having at least a pair of metal rolls.

4 Claims, 5 Drawing Sheets

U.S. PATENT DOCUMENTS 5,484,500 A * 1/1996 Kaufmann et al. .......... 156/198
5,618,367 A * 4/1997 Wilkinson et al. .......... 156/181

FOREIGN PATENT DOCUMENTS

| JP | 2-63816 A | | 3/1990 |
|----|-----------|---|--------|
| JP | 5-309781 | * | 11/1993 |
| JP | 5-318658 | * | 12/1993 |
| JP | 9-116254 | * | 5/1997 |
| JP | 9-283895 | * | 10/1997 |
| JP | 11-291391 | * | 10/1999 |
| JP | 11-291391 A | | 10/1999 |

* cited by examiner

F I G. 1 (a)
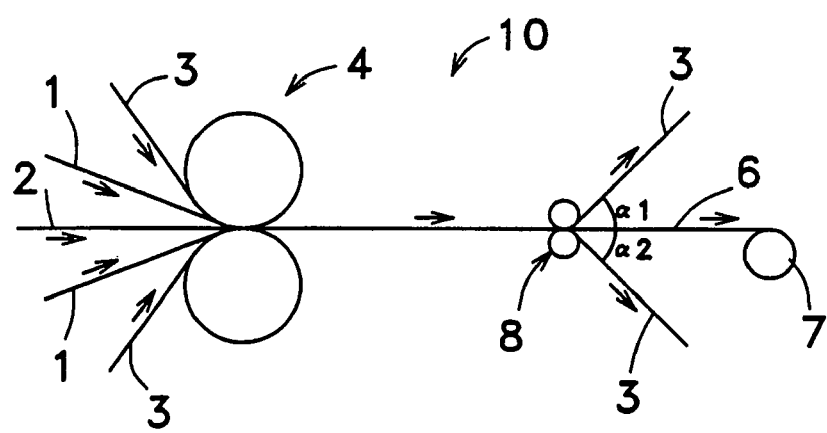
F I G. 1 (b)
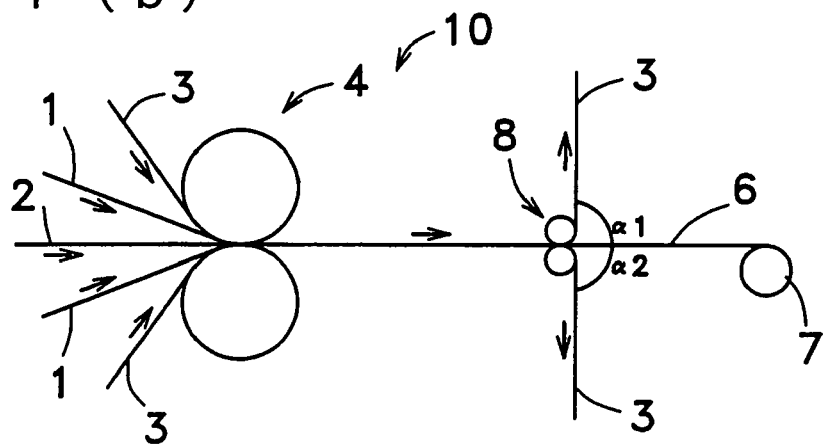

F I G. 4
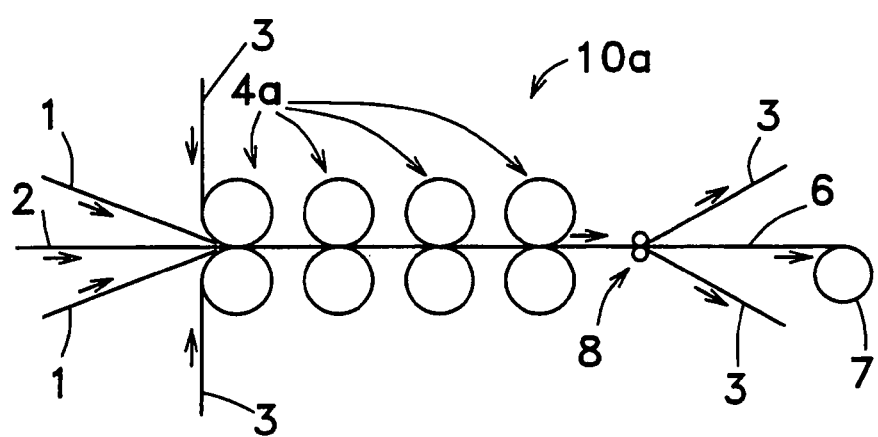

F I G. 5
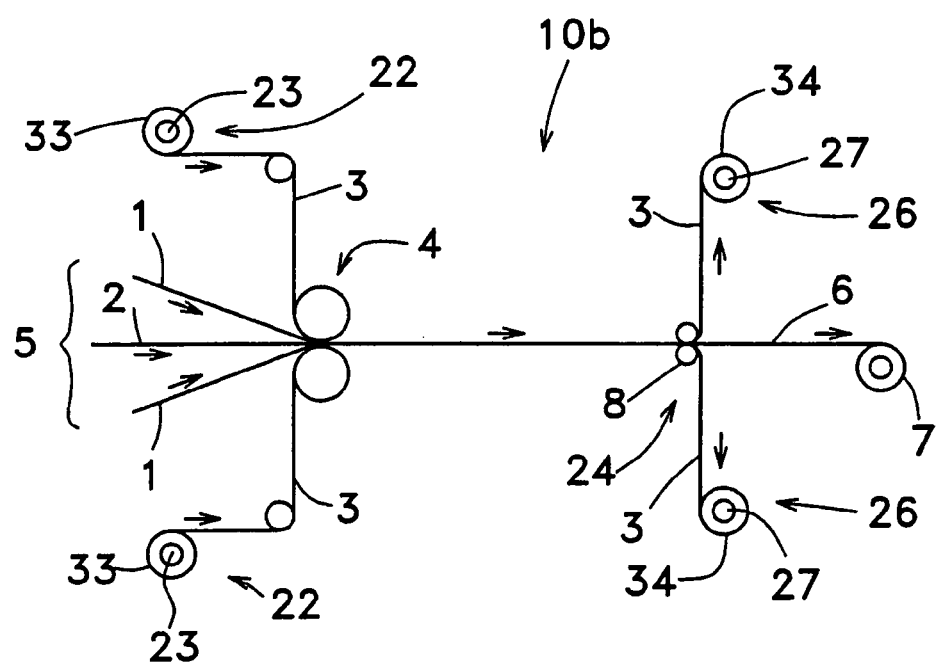

METHOD AND DEVICE FOR MANUFACTURING LAMINATED PLATE

RELATED APPLICATIONS

This application is a nationalization of PCT application PCT/JP00/07656 filed Oct. 30, 2000. This application claims priority from the PCT application and Japan Application Ser. No. 11/310,720 filed Nov. 1, 1999; Japan Application Serial No. 2000-126942 filed Apr. 27, 2000; Japan Application Serial No. 2000-126943 filed Apr. 27, 2000; Japan Application Serial No. 2000-244905 filed Aug. 11, 2000; Japan Application Serial No. 2000-248796 filed Aug. 18, 2000; Japan Application Serial No. 2000-248795 filed Aug. 18, 2000; and Japan Application Serial No. 2000-287552 filed Sep. 21, 2000.

The present invention relates to a method and a device for producing a laminate using a thermal-press forming device. More particularly, the invention relates to a method and a device for producing a flexible laminate used for electronic and electric equipment.

BACKGROUND ART

Laminates used for printed circuit boards for electronic and electric equipment include laminates wherein metallic foils are bonded with thermosetting adhesives such as thermosetting resin (hereinafter referred to as thermosetting laminates) and laminates wherein metallic foils are bonded with thermally fusible adhesives such as thermoplastic resin (hereinafter referred to as thermally fusible laminates).

Various methods for producing thermosetting laminates have been studied. Examples of these methods include a method for obtaining rigid laminates by thermosetting at a high temperature for several hours after pressing impregnated paper or impregnated glass cloths, and metallic foils using a multistage press or a vacuum press, a method for obtaining flexible laminates by thermosetting at a high temperature for some hours after laminating roll-type materials by sandwiching a pair of heated rolls, and a method for performing thermal lamination using a double-belt press instead of heated rolls. In these methods, a protective material may be sandwiched between pressing surfaces of the press and laminating materials to be heated and formed under pressure for the purpose of solving problems mentioned below. More particularly, protective materials may be used when the problems such as the appearance of scratches and scars on the surfaces of metallic foils (JP No. 60-109835) and the occurrence of warping of laminates when using a curing oven after thermal laminating (JP No. 4-89254), or the inhibition of smoother lamination caused by poorly evened with resin puddle impregnated paper or impregnated glass cloths, and the like arise.

When these thermosetting laminates are produced, the heating and forming under pressure temperature is virtually not higher than 200° C. Heat stress applied on laminating materials is small at such a low temperature, so that there is a low possibility of visual defects such as wrinkling which appear at the time of thermal lamination. On the contrary, thermal fusion is impossible unless heating at a temperature higher than the glass transition temperature (Tg) of the thermoplastic resin constituting bonding layers when producing thermally fusible laminates. On the other hand, thermoplastic resin in laminates for electronic and electric equipment constituting bonding layers is required to have a glass transition temperature at least not lower than 170° C. because of heating at a high temperature in the process of packaging parts. Accordingly, it is necessary to perform thermal lamination at a temperature not lower than 200° C. for thermal fusion. There was a problem that visual defects such as wrinkles may easily appear on the processed laminates at such a high temperature because of large change in thermal expansion and thermal shrinkage of the laminating materials.

Adhesives such as epoxy resin and acrylic resin adhesives are generally used for adhesive materials of the thermosetting laminates. Recently, however, heat resistance of substrates for on-vehicle systems used in bad environment such as high temperatures and heat resistance to solder reflow in lead-free soldering at a melting point higher than conventional solders by some ten degrees, and the like have been required as substrate characteristics, so that the conventional epoxy resin and acrylic resin adhesives have been regarded as insufficient in heat resistance.

Thus various kinds of polyimide adhesives combining heat resistance have been studied.

For example, a method for directly applying, drying, and curing polyimide varnishes and/or polyamic acid varnishes used as polyimide precursors onto metallic foils is known as a method for producing polyimide metallic foil laminates. In this method, solution-type varnishes were directly applied onto the metallic foils, so that the varnishes easily penetrated profiles on the metallic foil surfaces because of being in a solution state. This prevented small voids (micro voids) from occurring between the metallic foils and polyimide layers, even if the circuit pattern having a line width of 10 μm to 50 μm was formed. This method was, however, not satisfactory as circuit board materials because wrinkles, waviness, and warp, and the like appear on polyimide metal clad laminates caused by thermal shrinkage at the time of drying and curing the solvents when directly applying, drying, and curing the varnishes. Methods for producing polyimide metal laminates free from wrinkles, waviness, and warp have been proposed.

For example, JP No. 7-193349 discloses a method for producing a polyimide metal laminate by directly applying, drying, and curing a polyamic acid varnish used as a precursor for a thermoplastic polyimide varnish and/or a thermoplastic polyimide varnish onto a non-thermoplastic polyimide substrate to form a thermoplastic polyimide layer and bonding metallic foils to the surface of the thermoplastic polyimide layer by heating. Since the polyimide metal laminate obtained by the method is free from defectives such as wrinkling, waviness, and curls, the laminate is excellent as a circuit board material because of sufficiently strong peeling strength of the metallic foils and polyimide layer. Due to presence of micro voids with a diameter of 10 to 50 μm between the metallic foil and thermoplastic polyimide layer, the polyimide metal laminate was not good enough as a fine circuit pattern.

Recently, as electronic devices have been more and more downsized and reduced the weight, printed circuit boards, especially, flexible printed circuit boards constructed by the formation of a copper foil circuit on an insulating film have been demanded. Examples of common methods for producing flexible printed circuit boards include: forming a circuitry by continuously adhering a copper foil to be continuously provided onto an insulating film such as a polyimide film to be continuously provided with a thermosetting adhesive so that a circuitry may be formed on the copper foil by means such as etching; and forming a circuit on this copper foil by means such as etching by continuously laminating an adhesive film such as a polyimide film wherein a heat resistant thermoplastic adhesive has been previously formed on upper and lower surfaces to a copper foil by a continued application of heat.

Dimensional stability in these flexible printed circuit boards is strongly demanded to package high-density packaging parts used in cell phones and portable personal computers.

It is known that as described in JP No. 2-134241 and JP No. 10-126035, the dimensional stability highly depends on processing conditions when producing flexible laminates. For example, JP No. 10-126035 describes "Since an insulating film is lengthened and is laminated on a copper foil (a copper foil is hardly lengthened) in this state by the effects of tension in the adhesion process when the above-mentioned producing method is adopted, there are problems with the shrinking of a flexible printed circuit board because of the shrinkage of a polyimide film after the elongation distortion of the insulating film is released caused by partial elution of the copper foil when performing an etching processing to make a flexible printed circuit board by forming a circuitry. The coefficient of linear expansion of the polyimide film is greater than that of the copper foil when the polyimide film is laminated on the copper foil by heating, so that the polyimide film is laminated in the more elongated than the copper foil. Accordingly, when a circuitry is formed by the etching processing to make a flexible printed circuit board, there is a problem that the flexible printed circuit board is shrunk because of the shrinking of the polyimide film and releasing the elongation distortion due to partial elution of the copper foil at the time of etching process."

This JP No. 2-134241 disclosed plasma treatment and laminating at a low temperature from 60° C. to 120° C. The plasma treatment, however, had problems which caused an increase in cost of the product and cannot be carried out in-line processing when laminating at a temperature higher than 120° C.

In the JP No. 10-126035, there were problems that laminating was performed within the low temperature range of 50° C. to 120° C., so that laminating at a temperature higher than 120° C. did not exert its effects.

For methods for obtaining laminates by thermal laminating, as described above, a method for obtaining laminates by pressing using a heated roll laminating machine, a multistage press or a vacuum press device and a method for thermally laminating roll-type materials using a double-belt press and the like are performed.

It is, however, impossible to continuously laminate as in being performed in Roll-to-Roll because the multistage press and vacuum press device are single acting. Although the double-belt press is capable of continuously laminating, initial costs and maintenance fee, and the like are expensive, compared with a single-acting press device. Endless belts for the double-belt press are obtained by welding and polishing both ends of a continuous steel belt, which are disposed, sandwiching press rolls, so that scars caused by a joint of each belt are transcribed and their transcription portions may not be usable as a product due to nonuniformity in adhesion. In addition, a problem arises that laminating materials are irregularly bonded when laminating is performed using belts with extreme irregularity in thickness in a cross-machine direction because of the transmission of pressure of the press rolls to the laminating materials through each of the belt. Thus, uniformity in the surfaces of the belts should be fully noted in the double-belt press system.

Since heated roll laminating machines are employed for thermosetting resin whose laminating temperature is relatively as low as 100° C., the machines respectively have a configuration of rubber-metal roll or rubber—rubber roll. This configuration enables to pressurize in the cross-machine direction without any irregularity in pressure because of elasticity of the rubber, which leads to uniform laminating. When thermally fusible laminating materials having heat resistance are used, the heated roll laminating machines with rubber-rolls cannot be used for such purposes because of deformation of the rubber due to heat being required to be 250° C. or higher at the time of laminating.

It is an object of the present invention to provide a method for producing a thermally fusible laminating material and a heat resistant laminate which comprises a metal material suitable as a flexible printed circuit board free from visual defects such as wrinkles and curls when thermal lamination is performed at a high temperature.

It is another object of the present invention to provide a method and a device for producing a heat resistant-flexible laminate which is capable of being uniformly heated and pressurized at the time of thermal-press forming, wherein the surface of the laminate is uniform and inter-layers are favorably bonded.

DISCLOSURE OF THE INVENTION

A method for producing a laminate by thermally laminating a plurality of laminating materials containing a thermally fusible laminating material with a thermal-press forming device according to the present invention which comprises: arranging a protective material between a pressing surface of the thermal-press forming device and the plurality of laminating materials; laminating the materials by thermal pressure at not lower than 200° C., wherein the bonded laminating materials are in contact with the protective material; cooling the bonded laminating materials; and peeling off the protective material from the bonded laminating materials.

In another aspect of the method for producing a laminate according to the present invention, the plurality of laminating materials may be continuously laminated each other.

In still another aspect of the method according to the present invention, the thermal-press forming device may be equipped with a pair of or pairs of metal rolls.

In a further aspect of the method according to the present invention, the thermal-press forming device may be a double-belt press equipped with a pair of endless steel belts.

In a still further aspect of the method according to the present invention, the metal roll may each have a diameter of not smaller than 200 mm.

In another aspect of the method according to the present invention, the metal roll may have circularity of not greater than 0.05 mm, cylindricity of not greater than 0.05 mm, and surface roughness of not greater than 0.01 mm.

In still another aspect of the method according to the present invention, the temperature difference of the metal roll in an axial direction may be not greater than ±10° C.

In a further aspect of the method according to the present invention, the metal roll may have surface roughness of not smaller than Hs50.

In a still further aspect of the method according to the present invention, the protective material has a thickness of not smaller than 50 μm.

In another aspect of the method according to the present invention, the protective material may be a polyimide film.

In still another aspect of the method according to the present invention, the polyimide film may be non-thermoplastic.

In a further aspect of the method according to the present invention, the protective material may have elastic modulus in tension of not smaller than 490 N/mm$^2$ and a coefficient of linear expansion of not greater than 100 ppm/° C. from 200° C. to 300° C.

In a still further aspect of the method according to the present invention, the protective material may be in a shape of continuous sheet wound up in a roll shape.

In another aspect of the method according to the present invention, the protective material may be preheated before being thermally laminated by a thermal-press forming device.

In still another aspect of the method according to the present invention, the preheated temperature may be higher than the thermally pressuring temperature.

In a further aspect of the method according to the present invention, the protective material may be mounted in a shape to cover part of the heated rolls or the belt of the thermal-press forming device to be preheated.

In a still further aspect of the method according to the present invention, the protective material may be repeatedly used.

In another aspect of the method according to the present invention, a plurality of the laminating materials are sandwiched by a pair of the protective materials, wherein the protective materials may be respectively peeled off at a symmetrical angle assuming the bonded laminating materials as a plane of symmetry.

In still another aspect of the method according to the present invention, the tension held on the thermally fusible laminating material before being laminated by the thermal-press forming device is the minimum to stably proceed straight so that the tension of the metal material may be at least three times stronger than that of the laminating materials.

In a further aspect of the method according to the present invention, the thermally fusible laminating material may have a tension from 0.1 to 3.0 N/mm$^2$.

In a still further aspect of the method according to the present invention, at least one laminating material out of a plurality of laminating materials may be shaped in a continuous sheet wound up in a roll state.

In another aspect of the method according to the present invention, an adhesive component of the thermally fusible laminating material may be a resin containing thermoplastic polyimide not smaller than 50 wt %.

In still another aspect of the method according to the present invention, the thermally fusible laminating material is a single-layer film including a resin containing at least 50 wt % of thermoplastic polyimide.

In a further aspect of the method according to the present invention, the thermally fusible laminating material may be a plural-layer film having a resin layer containing thermoplastic polyimide of not smaller than 50 wt % on one side or both sides of a non-thermoplastic polyimide film.

In a still further aspect of the method according to the present invention, the thermally fusible laminating material may be a sheet impregnated with a resin containing thermoplastic polyimide of not smaller than 50 wt % in a fibrous sheet substrate.

In another aspect of the method according to the present invention, the thermally fusible laminating material may be a heat resistant adhesive material having a glass transition temperature of at least 170° C.

In still another aspect of the method according to the present invention, the plurality of laminating materials contain a metal material.

In a further aspect of the method according to the present invention, the metal material may be a metallic foil having a thickness not greater than 50 µm.

In a still further aspect of the method according to the present invention, the metallic foil may be at least one kind selected from a group consisting of copper, nickel, aluminum, and stainless steel or an alloy in combination.

In another aspect of the method according to the present invention, the metallic foil may be a copper foil.

In still another aspect of the method according to the present invention, the absolute value of the rate of dimensional change of a laminate after being heated at 150° C. for 30 minutes and then returning to room temperature after removing the metal material from the laminate wherein the thermally fusible laminating material and the metal material are laminated may be not greater than 0.10% both in machine and transverse directions.

In a further aspect of the method according to the present invention, the maximum height of the surface roughness (Rmax) of the metallic foil may be 15 µm or less, the average roughness of 10 points (Rz) may be 10 µm or less, and center line average roughness (Ra) may be 2 µm or less.

The thermal-press forming device according to the present invention is used to thermally laminate a plurality of laminating materials including a thermally fusible laminating material, which is equipped with a pair of or pairs of metal rolls for laminating the plurality of laminating materials by thermal pressure at not lower than 200° C.

Further, the thermal-press forming device according to the present invention is a device for thermally laminating a plurality of laminating materials including a thermally fusible laminating material by mounting a protective material peeled off from the plurality of laminating materials after thermally pressing a laminate which comprises: means for feeding the protective material; means for guiding the protective material to a position adjacent to the protective material being in contact with the bonded laminating materials where the protective material is peeled off; and means for taking up the protective material.

In the thermal-press forming device, the metal roll may have a diameter of not smaller than 200 mm.

In the device according to the present invention, the metal roll may have circularity of not greater than 0.05 mm, cylindricity of not greater than 0.05 mm, and surface roughness of not greater than 0.01 mm.

In the device according to the present invention, the temperature difference of the metal roll in an axial direction may be not greater than ±10° C.

In the device according to the present invention, the metal roll may have surface roughness of not smaller than Hs50.

BRIEF DESCRIPTION OF THE DRAWINGS

FIGS. 1 (*a*) and 1 (*b*) are side diagrams for respectively showing a thermal-press forming device used for a method for producing a laminate according to the present invention.

FIG. 4 is a side diagram for showing a thermal-press forming device with plural pairs of metal rolls.

FIG. 5 is a side diagram for showing a thermal-press forming device equipped with metal rolls for producing a laminate according to the present invention.

BEST MODE FOR CARRYING OUT THE INVENTION

Figure 2:
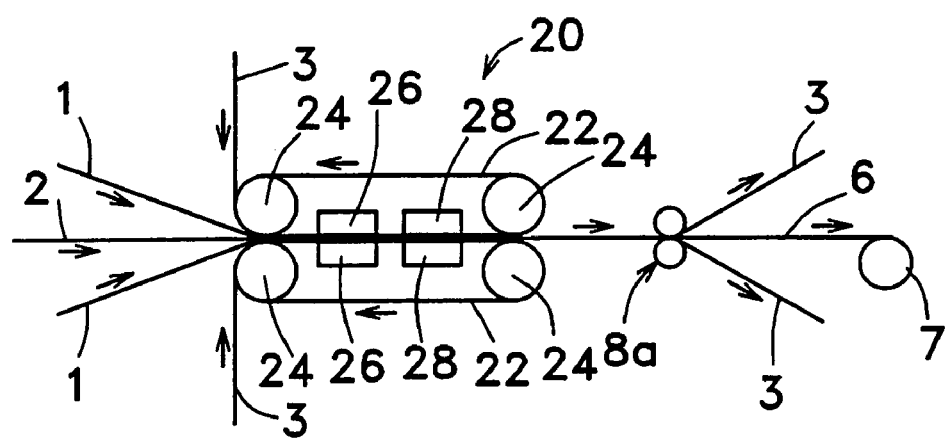
FIG. 2 is a side diagram of another thermal-press forming device for showing a method for producing a laminate according to the present invention.

In a method for producing a laminate by thermally laminating a plurality of laminating materials including a thermally fusible laminating material, for example, thermoplastic polyimide and copper foil at a temperature of not lower than 200° using a thermal-press forming device, the inventors of the present invention have found out that a laminate obtained by laminating each other is free from wrinkles because of limited motions of a thermoplastic polyimide resulted from the restriction of motions in an axial direction for the reason of the presence of a protective material outside a copper foil, although the thermoplastic polyimide tends to be shrunk after being laminated by laminating a thermoplastic polyimide on a copper foil when the protective material is arranged outside the laminating material at the time of adhesion and have achieved the invention mentioned below.

Further, in view of the fact that a laminating method using conventional rubber rolls become deteriorated due to heat, which results in non-uniform bonding, the inventors of the present invention have achieved a method and a device for producing a heat resistant laminate with a pair of or pairs of metal rolls because high heating temperatures exceeding the heat resistant temperature of rubber rolls are needed in a method for producing a laminate by thermally laminating a plurality of laminating materials including a thermally fusible laminating material having heat resistance, for example, a thermoplastic polyimide and a copper foil, using a thermal-press forming device.

First, an explanation will be given to causes for visual defects such as wrinkles. For example, when copper foil and thermoplastic polyimide are bonded by a heated roll laminating machine, the copper foil and thermoplastic polyimide are bonded after being thermally pressured by passing between the press rolls of the heated roll laminating machine. When thermal lamination is performed, each laminating material is expanded due to heat and the thermoplastic polyimide is thermally laminated on the copper foil in a state of elongation which is more lengthened than the copper foil in a planar direction because the coefficient of linear expansion of the thermoplastic polyimide is generally greater than that of the copper foil. On the contrary, planar shrinkage of the thermoplastic polyimide is greater than that of the copper foil when cooling. Accordingly, wrinkles appear on the produced laminate in the planar direction. Even if pressure is released immediately after thermal pressure, the thermally pressured materials maintain heat. The thermoplastic polyimide in a state of flux because of its temperature which is higher than the glass transition temperature (Tg) of the thermoplastic polyimide, which cannot inhibit the appearance of wrinkles is considered to be a contributing factor for visual defects.

To solve this problem, in a preferred embodiment of the present invention, a protective material is disposed between a pressing surface of the thermal-press forming device and a plurality of laminating materials including a thermally fusible laminating material to be thermally pressured and the protective material is peeled off from the laminated laminating materials after cooling the thermally pressured laminating materials and the protective material lightly attached to the laminating materials when producing a laminate by thermally laminating a plurality of laminating materials including a thermally fusible laminating material to each other using a heating device. Laminating materials herein mean sheets or plate-like materials such as films to be integrated as a laminate. The thermally fusible laminating material herein means a laminating material having functions to bond laminating materials to each other by heating fusion. The protective material does not constitute a laminate.

Thus, it is possible to produce a heat resistant laminate free from wrinkles and warps, even if the melting point of the thermally fusible laminating material is high, which requires thermal pressure at 200° C. or higher.

FIGS. 1 (a) and 1 (b) respectively show an example of a thermal-press forming device and an embodiment of processing in producing a laminate according to the present invention. In FIGS. 1 (a) and 1 (b), a thermal-press forming device 10 is equipped with a pair of metal rolls 4 used as thermally pressured rolls. An adhesive film 2 to be used as a laminate material and copper foils 1 sandwiching the adhesive film 2 are supplied to the metal rolls 4. After the laminating materials and protective films 3 are thermally pressured by the metal rolls 4 to bond the adhesive film 2 to the copper foils 1, the protective films 3 are peeled off and a laminate 6 is produced by laminating the adhesive film 2 on the copper foils 1 to be taken up as a reel 7.

Peeling assistant rolls (guiding means) 8 are arranged downstream of the metal rolls 4 and the laminating materials and the protective films 3 lightly in contact with the materials are naturally cooled or forcedly cooled when they pass between the metal rolls 4 and the peeling assistant rolls (guiding means) 8. Subsequently, the protective films 3 are peeled off where the peeling assistant rolls (guiding means) 8 which are adjacent to the protective films 3 and guides the films 3 are discharged. Forced cooling can be performed by means of blowing cool wind or contacting to a substance of a low temperature.

The peeling assistant rolls 8 are guiding means for guiding a protective material such as the protective film 3 to be peeled off at a fixed position, so that the rolls 8 may be obedient rolls for obeying at the contact of the protective material. The rolls 8 may be positive-rotating rolls or fixed rolls. As long as the peeling assistant rolls 8 guide the protective material, a material having a cross-section in a non-circular shaped like a bar or a plate may be disposed as guiding means.

In another embodiment of the present invention, a double-belt press equipped with a pair of endless steel belts is used. FIG. 2 shows an example of a configuration of a double-belt press. In FIG. 2, a double-belt press 20 is equipped with a pair of endless steel belts 22. An adhesive film 2 to be used as a laminated film and copper foils 1 sandwiching the adhesive film 2 to be similarly used as laminating materials are fed to the endless steel belts 22. After the laminating materials and protective films 3 are thermally pressured by the endless steel belts 22 to bond the adhesive film 2 to the copper foils 1, the protective films 3 are peeled off and a laminate 6 is produced by laminating the adhesive film 2 on the copper foils 1 to be taken up as a reel 7. Each of the endless steel belts 22 is equipped with heating guides 26 for heating and guiding the endless steel belts 22. Cooling guides 28 for cooling and guiding the endless steel belts 22 are disposed downstream of the heating guides 26. The heating guides 26 and cooling guides 28 are so arranged that spacing between the upper and lower endless steel belts 22 may be small, so that a workpiece is pressurized when passing between the upper and lower endless steel belts 22. The work is heated when passing through a portion heated by the heating guides 26 of the endless steel belts 22 and is cooled when passing through a cooled portion.

The peeling assistant rolls 8 are disposed downstream of the endless steel belts 22 for the same purpose as in FIG. 1. The peeling assistant rolls 8 are not necessary, if cooling is sufficiently performed by the cooling guides 28.

In still another embodiment, a double-belt press has a system for thermally pressing with upper and lower endless steel belts sandwiched by a pair of rolls or pairs of rolls.

In a further embodiment of the present invention, it may be possible to heat and pressurize a multi-layer work obtained by superimposing a set of work, wherein laminating materials are respectively sandwiched midway between a pair of protective materials, on a set of or a plurality sets of work having the similar configuration. In this case, the protective materials are thermally pressured to be processed without contact to the pressing surface of the thermal-press forming device except for the protective materials respectively positioned on the front and reverse sides of the multi-layer material to be processed. More particularly, in the present invention, a part of the protective material out of the plurality of protective materials arranged at the time of thermal pressure for processing, may be thermally pressured without contact to the pressing surface of the thermal-press forming device.

As mentioned above, protective materials are used to prevent visual defects such as wrinkles for occurring on a laminate containing a thermally fusible laminating material in the present invention. Although JP No. 60-109835 and JP No. 4-89254 disclose a method for thermally pressing and forming with a protective material sandwiched between a pressing surface and laminating materials, both of them relate a method for producing a thermosetting laminate. Accordingly, the thermally pressing and forming temperature was as low as 200° C. in most cases in these inventions, so that visual defects such as wrinkles seldom appeared. In addition, objects of these inventions are not to prevent wrinkles from appearing but to prevent scratches and scars from appearing on the metallic foil surface and prevent a laminate in a curing oven from warping after being thermally laminated. There is a possibility that a protective material may be used, if problems such as impairment of more smooth laminating arise due to impregnated paper or impregnated glass cloths in poor smoothness with resin lump, but this is quite different from the object of the present invention.

In the present invention, therefore, it is preferable to keep modulus in tension at adhesion temperatures not smaller than 490 N/mm$^2$ because the protective materials are unable to act as protective materials unless a certain hardness of the protective materials is maintained when heating.

If the modulus in tension is less than 490 N/mm$^2$, cracks may appear on the protective materials due to the pressure to be heated and applied. Further, the coefficient of the linear expansion is preferably not greater than 100 ppm/° C. If the coefficient of linear expansion is greater than 100 ppm/° C., it will have harmful effects such as wrinkles on the surface of the laminating materials after laminating because the dimension of the protective materials is greatly changed according to the heating-cooling cycle when laminating, comparing with the laminating materials.

Any protective materials may be used as long as these materials protect the laminating materials from shrinking which achieve the objective to prevent visual defects such as wrinkles of the product from appearing. These protective materials should, however, be resistant to the temperature at the time of processing. For example, when processing is carried out at 250° C., the polyimide film preferably has heat resistance at least 250° C. When processing is carried out at 300° C., the polyimide film preferably has heat resistance at least 300° C. When the thermally pressuring temperature is 300° C., the protective materials become lengthened, which results in inability to work, even if polyphenylene-sulfide-films are used as protective materials. When polyimide films generally available in the market are used as protective materials, the thickness of the protective materials is preferably not smaller than 50 μm from the viewpoint of protecting the laminate from wrinkle formation after laminating. It is more preferable for the protective materials to have a thickness of not smaller than 75 μm because of perfect protection against wrinkle formation.

Figure 3:
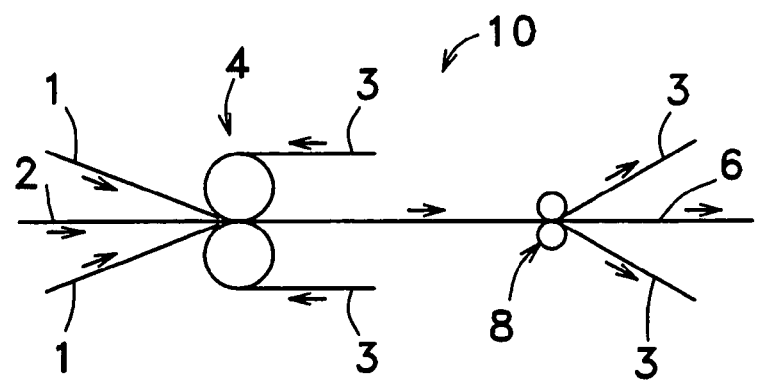
FIGS. 3 (*a*) and 3 (*b*) are side diagrams for showing the contact situation between metal rolls and a protective material of a thermal-press forming device according to the present invention.
Figure 3:
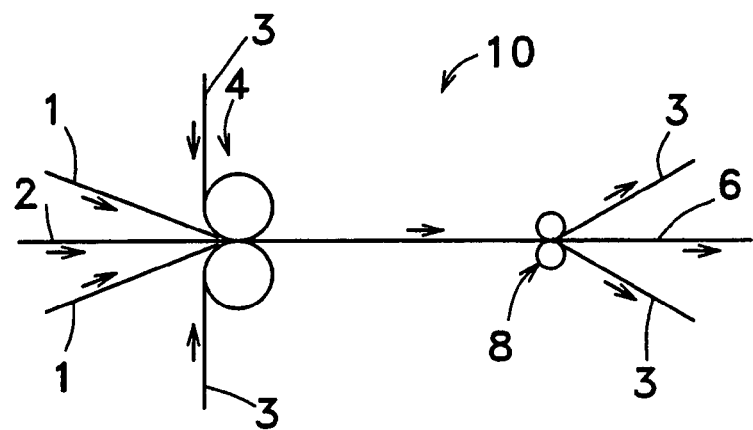

Since the protective materials are required to be at a predetermined temperature in a state of arrangement when the laminating materials are thermally pressured, the protective materials are preferably preheated before heating and pressuring the laminating materials. It is preferable for the preheating temperature to exceed the thermally pressuring temperature from the viewpoint of reducing expansion wrinkles caused by heating resulting from the protective materials. When a thermal-press forming device whose components are heated rolls and belts, more particularly, a heated roll laminating machine and a double-belt press, it is possible to preheat the protective materials by coming into contact with the heated rolls or part of the belts in a covered form. The time for the protective materials in contact with the heated rolls or belts at this time is preferably not shorter than 1 second, more preferably not shorter than 10 seconds, and it is particularly preferable not shorter than 15 seconds. It is possible to preheat the protective materials by selecting the suitable roll diameter in accordance with this contact time and making the protective materials attached to a portion of the heated rolls; ¼ round circle or more, ½ round circle. Consequently, the protective materials become a predetermined temperature at the point of adhesion of the laminating materials, so that the laminating materials can be laminated each other free from expansion wrinkles on the protective materials, which enables to prepare a laminate free from wrinkles. FIG. 3 (*a*) shows an embodiment in which protective materials (protective films 3) are attached to the heated rolls 4 at the ½ round circle. FIG. 3 (*b*) shows an embodiment in which protective materials (protective films 3) is attached to the metal rolls 4 which are designed to be thermally pressured rolls at ¼ round circle. Immediately after thermal pressure, the protective material and the laminating materials bonded by thermal pressure, that is, the protective material is in contact with the laminate. When the laminate is peeled off from the upper and lower protective material, if pass lines which the peeled off protective material goes forward are unsymmetrical in top and bottom upper and lower protective material, the laminate will be curled with the laminate peeled off, pulling toward the protective material because the protective material is lightly in intimate contact with the laminate when the remaining protective material and laminate are peeled off by previously peeling off one of the upper and lower protective material. To prevent this from occurring, it is preferable to make respective peeling angles of the upper and lower protective material equivalent, assuming the laminate as a plane of symmetry when peeling off the protective material.

FIG. 1 shows peeling angles of an upper and lower protective material as α1 and α2. These peeling angles are each an angle which is made to form the protective films 3 used as protective material and a laminate 6. FIG. 1 (a) shows a case wherein α1 and α2 are both acute angles. FIG. 1 (b) shows a case wherein α1 and α2 are both normal. In either cases, stable working is carried out, but the difference between the upper and lower peeling angles, i.e. |α1−α2| is preferably within 30 degrees, more preferably within 10 degrees.

When peeling off the protective material, it is preferable that the temperature of a laminate is not higher than the Tg of its thermoplastic resin, if thermoplastic resin is used as one of laminating materials or components because the protective material is unable to be peeled off easily when the temperature of the work is high at the time of peeling off the protective material, which results in curling by force. More preferably, the temperature is not higher than the Tg by 50° C. and it is the most preferably not higher than the Tg by 100° C. It is the most preferable to peel off the protective material from the laminate at the point of cooling to roan temperature.

As shown in a thermal-press forming device 10 in the above-mentioned FIG. 1, it is, therefore, preferable to arrange peeling assistant rolls 8 downstream the metal rolls 4 and cool the work between the metal rolls 4 and peeling assistant rolls 8.

Protective materials can be repeatedly used in the present invention. The protective materials can be recycled by re-mounting the once used protective materials at an end position after taking up the protective materials with a reel because of the mounting feeding and take-up devices for the protective materials in addition to mounting the feeding and take-up devices for the laminating materials ahead and behind the heated roll laminating machine. The protective materials may accurately be taken up with their ends evened up by mounting an end position sensor and a take-up position compensator when taking up the protective materials.

On the other hand, the tension that acts on the thermal fusible laminating materials before being laminated by the thermal-press forming device is preferably the minimum for the laminating materials to stably proceed straight ahead. More specifically, for example, a 25-μm three-layer structured adhesive film containing thermoplastic polyimide resin component with the glass transition temperature of 190° C. on both sides of a non-thermoplastic polyimide film (PIXEO BP produced by KANEKA CORPORATION) is employed as a thermal fusible laminating material, and rolled copper foils having a thickness of 18 μm and in addition, a polyimide film (Apical 125AH, produced by KANEKA CORPORATION) are employed on the both sides of the adhesive film as protective materials. A heat resistant flexible laminate is prepared using a thermal-press forming device similar to the device shown in FIG. 1 (a) under conditions of temperature at 300° C., linear pressure at 490 N/cm, and processing rate at 2 m/min. If the tension of the film in the thermal fusible laminating material at that time is set at 0.5 N/mm$^2$ and the tension of the copper foils is set at 10 N/mm$^2$, the rate of dimensional change will be extremely as small as −0.037% (MD: machine direction) and 0.034% (TD: transverse direction). The rate of dimensional change herein means the rate of dimensional change of a laminate relative to the laminate laminated by the thermal fusible laminating material and metal material after removing the metal material from the laminate by front etching and the like, heating at 150° C. for 30 minutes, and then returning the temperature to room temperature.

When the tension of the film for the thermally fusible laminating material is set at 0.01 N/mm$^2$ and the tension of the copper foils is set at 5 N/mm$^2$ in the same conditions, it is impossible to prepare a continuous sample due to film meandering, so that it is preferable to control the tension of the laminating material within the range between 0.1 N/mm$^2$ and 3.0 N/mm$^2$ from the viewpoint of travel stability and the restriction of the rate of the dimensional change to the low rate. Further, the tension of the metal material is set at three times as large as that of the thermal fusible laminating material.

A laminate having a small rate of dimensional change can be obtained by setting the tension of the thermal fusible laminating material and the metal material in the condition mentioned below. More particularly, it is possible to obtain the absolute value of the rate of the dimensional change of the laminate relative to the laminate laminated by the thermal fusible laminating material and metal material at not higher than 0.1% on the machine direction and transverse direction after removing the metal material from the laminate by front etching and the like and heating at 150° C. for 30 minutes.

The thermal fusible laminating material in the present invention is employed as an adhesive film. Although examples of the thermal fusible laminating material in the present invention include a single-layer film made from resin with thermal fusibility, a plural-layer film forming a resin layer with thermal fusibility on both sides of a core layer without thermal fusibility, and an impregnated sheet with thermal fusibility on a base material such as paper and glass cloths and the like, a single-layer film which comprises a resin with thermal fusibility and a plural-layer film wherein resin with thermal fusibility is formed on the both sides of core layer without thermal fusibility are preferable for the flexible laminate because of poor flexibility in a base material with high rigidity such as a glass cloth. A single-layer film with thermal fusibility and a plural-layer film which comprises a resin layer with thermal fusibility on the both sides of the core layer without thermal fusibility are preferably heat resistant. A substance whose adhesive component is consisted of a thermoplastic polyimide-type component, for example, thermoplastic polyamide imide, thermoplastic polyether imide, and thermoplastic polyester imide may be preferably used. A thermal fusible laminating material containing such heat resistant thermoplastic resin not lower than 50% out of the adhesive component may be preferably used as an adhesive film in the present invention. Especially, an adhesive film compounding thermosetting resin such as epoxy resin or acrylic resin is preferably used. To improve each kind of characteristics, various additives may be mixed in adhesive films.

Although a single-layer structure consisted of a thermally fusible adhesive component may be used for an adhesive film as long as it has a heat resistant adhesive layer outside, a film having three-layer structure wherein thermally fusible adhesive layers are closely arranged on both sides of a non-thermally fusible core layer are preferable from the viewpoint of dimensional stability.

A method for preparing an adhesive film is not particularly limited, but when the adhesive film comprises a single-layer adhesive layer, a film can be deposited by a belt-cast method and an extrusion method and the like. When an adhesive film comprises three layers: an adhesive layer; a core layer without thermal fusibility; and an adhesive layer, there are methods for preparing a three-layer adhesive film by applying an adhesive on one side each or both sides simultaneously and preparing a three-layer adhesive film by laminating a single-layer adhesive film which comprises an adhesive film on both sides of a heat resistant film. In the method for preparing a three-layer adhesive film by the application of an adhesive, particularly, when a polyimide-type adhesive is used, there are two methods: a method for applying an adhesive in a state of polyamic acid to perform imidization while drying and a method for applying soluble polyimide resin as it is and drying, and methods for forming an adhesive layer are not particularly limited. In addition to these methods, there is a method for depositing a heat resistant adhesive film by the simultaneous extrusion of each of the adhesive layer, the core layer without thermal fusibility, and the adhesive layer.

For the thermally fusible laminating material in the present invention, a heat resistant adhesive material having a glass transition temperature of not lower than 170° C. is more preferable from the point that components such as an integrated circuit, resistance, and a condenser are packaged on a substrate and the substrate is not peeled off due to heat at the time of undertaking the solder reflow process.

Metal materials, above all metallic foils to be used as conductive layers are preferably used as one of a plurality of laminating materials.

Examples of metallic foils include: copper and copper alloy, stainless steel and alloy, nickel and nickel alloy (including 42 alloy), aluminum and aluminum alloy and the like. Metallic foils are preferably copper and copper alloy and copper foils with a thickness of not greater than 50 µm in view of flexibility of a heat resistant flexible circuit board is more preferable. Examples of copper foils include rolled copper foils, electrolytic copper foils, and HTE copper foils, but these are not particularly limited. Copper foils wherein an adhesive or an antiseptic layer or a heat resistant layer (e.g. plating treatment such as chrome, zinc, and nickel) is respectively formed on its surface may be used.

Particularly, since the copper foils with a thickness of not greater than 35 µm are less elastic than the copper foils with a greater thickness and wrinkles easily appear when laminating by heating, the present invention exerts its prominent effects when using copper foils with a thickness of not greater than 35 µm.

The surface roughness of the metal materials joined to the thermally fusible laminating material greatly affects the performance of the laminate. In the present invention, a metal material having a maximum height (Rmax) of the side of the surface roughness of the metal material bonded to the thermally fusible laminating materials is not greater than 15 µm, average roughness out of 10 points (Rz) is not greater than 10 µm, and a center line average roughness (Ra) is not greater than 2 µm, are selected to be used. Rmax, Rz, and Ra herein used are values measured in accordance with the Japanese Industrial Standards (JIS) B0601. As surface roughness becomes larger, it will increase the tendency to form voids between the laminating materials and the metal material.

The thermal-press forming device in the present invention is not particularly limited as long as it is a device for thermally pressuring laminating materials. For examples, examples of the thermal-press forming device include: a single-action press, a multistage press, a vacuum press, a multistage vacuum press, an autoclave device, heated roll laminating machine, and a double-belt press and the like. Above all, a heated roll laminating machine and a double-belt press may be preferably used because of being effectively continuous productivity and obtaining a laminate of stable quality. Using a combination of continuous sheets wound in a roll state as protective materials and these devices enables effective continuous production of laminates, which leads to improve productivity. Particularly, using a combination of a heated roll laminating machine or a double-belt press and continuous sheets wound in a roll state enables the most effective continued production of laminates.

Heating methods in the present invention are not particularly limited as long as the methods can heat at a predetermined temperature, and these methods include heating medium circulating systems, hot air heating systems, and dielectric heating systems and the like. It is preferable to heat at not lower than 200° C., but it is preferable to heat at not lower than 240° C. to use thermally fusible sheets having suitable Tg when a laminate is used for a use in the passage of a solder reflow furnace having an atmospheric temperature of 240° C. for packaging of electronic parts. Pressuring systems used in the present invention are not particularly limited as long as these systems can apply at predetermined pressure. Examples of these systems include hydraulic systems, pneumatic systems, and pressure systems between gaps and the like.

In the embodiment of the present invention using a pair of or pairs of metal rolls, there is no such nonuniformity under pressure caused by a joint of each belt when processing with a double-belt press, so that with the use of the metal rolls, it needs less device costs and maintenance costs than the double-belt press does.

As mentioned above, the use of metal-rubber rolls instead of a pair of metal rolls causes problems on the point of heat resistance in rubber. For example, it is impossible to laminate a heat resistant adhesive film containing thermoplastic polyimide with a glass transition temperature of 190° C. on both sides of a non-thermoplastic polyimide film and rolled copper foils due to deterioration of rubber rolls caused by heat when trying to laminate processing on condition that the temperature is 300° C., the linear pressure is 490 N/an, and the processing speed is 2 m/min using a thermal-press forming device which comprises metal-rubber rolls (metal rolls: diameter of rolls: 300 mm, circularity: 0.002 mm, cylindricity: 0.002 mm, surface roughness: 0.001 mm, and temperature distribution accuracy at 300° C.: ±2° C.).

An explanation will now be given to an embodiment using metal rolls. In the embodiment using metal rolls, a thermal-press forming device 10 as shown in FIGS. 1 (a) and 1 (b) is used. A plurality of laminating materials containing a heat resistant thermally fusible laminating material, for example, thermoplastic polyimide and copper foils are laminated by this thermal-press forming device 10. In FIG. 1, the heating and pressuring forming device 10 is equipped with a pair of metal rolls 4 for thermal pressure, wherein an adhesive film 2 such as a heat resistant adhesive film and copper foils 1 sandwiching the adhesive film 2 are provided. The adhesive film 2 and the copper foils 1 are laminated by thermal pressure to obtain a laminate 6 and the laminate 6 is taken up.

The embodiment of the thermal-press forming device as shown in FIG. 4 is also possible. The thermal-press forming device 10a in FIG. 4 is equipped with plural pairs of metal rolls 4a, which are arranged in-line in a traveling direction of the film, and the adhesive film 2 and the copper foils 1 sandwiching the adhesive film 2 pass these pairs of the metal rolls 4a in the order of sequence to be formed and processed. In FIG. 4, at least a pair out of plural pairs of the metal rolls 4a, for example, a pair of metal rolls positioned in the left end in the figure are heating and pressuring rolls.

The roll diameter of the metal roll is preferable to be not smaller than 200 mm because pressure is abruptly applied on the laminating materials at the time of thermal pressure in the case the roll diameter is smaller than 200 mm, which results in visual defects.

In the thermal-press forming device with metal rolls as shown in FIG. 4 or FIG. 1, the appearance dimension of the metal roll is preferable to have circularity of not greater than 0.05 mm, cylindricity of not greater than 0.05 mm, surface roughness of not greater than 0.01 mm to apply uniform pressure in a cross-machine direction. If the two metal rolls placed up-and-down have more dimensional error than the above, 0.1 mm of crevices can be formed between the rolls in total of top and down. When the laminating materials have a thickness of not greater than 0.1 mm, some portions are pressed and some portions are not pressed, which results in a tendency of nonuniform pressure applied on the sample. When the surface roughness is greater than 0.01 mm, irregularity is appeared on the roll surface, which results in a tendency of difficulty in being uniformly pressurized.

Further, to apply uniform pressure in the cross machine direction and provide a uniform temperature, the temperature difference in an axial direction of the metal roll is preferably not greater than ±10° C. When there is a temperature difference of not smaller than 10° C. between the central portion and the end of the metal roll, the difference in roll diameter between the central portion and end caused by the difference in expansion coefficient of the metal roll because of temperature difference, so-called thermal crown occurs. Since this thermal crown causes heat deformation of the rolls by approximately 3 μm per degree, 30 μm of crevices are formed, 60 μm of crevices in total of up and down are formed when there is a temperature difference of 10° C. Accordingly, when there is a time difference of 10° C. or more in the axial direction of the metal roll, pressure to be applied tends to be nonuniform.

The surface of the metal roll needs to have shore hardness of not smaller than Hs50. If the shore hardness is not greater than Hs50, adherents to the surface of the rolls such as metal waste and abrupt level difference due to the bending of the laminating materials in the process of pressuring will results in scars on the surface of the rolls because of both upper and lower thermally pressuring rolls are metal rolls. Thus, it is preferable to plate a metal base with chrome for industrial uses. This chrome plating for industrial uses enables to improve the hardness of the metal base between Hs20 and Hs30 to Hs50 or greater. When the thickness of plating is smaller than 0.05 mm, cracks appear on the surface of plating after using at a high temperature for a long time, so that the thickness is preferably not smaller than 0.05 mm.

When thermally pressuring, nonuniformity in crevice in the longitudinal direction of the metal rolls becomes nonuniformity in applied pressure in the longitudinal direction, but in the thermal-press forming device of the present invention, nonuniformity in crevice-created in the longitudinal direction of the metal rolls is absorbed by the deformation of the laminating materials because the laminating materials are thermally pressured by being sandwiched by the protective materials, which result in uniform pressuring of the laminating materials. When the protective materials have a thickness of not smaller than 50 μm, the laminating materials are uniformly heated and pressurized to be uniformly bonded. The thermal-press forming device of the present invention preferably takes a form as shown in FIG. 5. In FIG. 5, a thermal-press forming device 10b is equipped with feeding means 22 for feeding protective materials 3 to metal rolls 4, guiding means 24 for peeling off the protective materials from a laminating material 5 in a predetermined position, and taking-up means 26 for taking up the peeled protective materials 3. The laminating material 5 comprises an adhesive film 2 and copper foils 1. More specifically, revolving rolls 23 mounted at the core in reels 33 of the protective materials 3 are employed as the feeding means 22, but the feeding means 22 are not limited to these embodiments shown in the figure as long as they have a function to feed the protective materials 3. The taking-up means 26 are designed to take up the peeled protective materials 3 to wind up to revolving rolls 27 as reels 34, but they are not limited to these embodiments shown in the figure as long as they have a function to take up the protective materials 3. The guiding means 24 comprises peeling assistant rolls 8. The peeling assistant rolls 8 are guiding means for peeling off protective materials such as the protective films 3 in place, so that these rolls may be driven rolls for driving by contacting the protective materials. They may be positively revolving rolls. They may be fixed rolls. The guiding means 24 may have a rod-type or plate-type cross section which is non-circular as long as the means guides the protective materials.

Although it is effective for uniform pressuring to wrap resin made of similar material to that of the protective materials around the metal rolls 4 for heating and pressuring or coat the metal rolls with the resin to be bonded to each other, there are disadvantages of incapability of a long-duration use due to unstuck adhesion in this embodiment. This embodiment has a problem of rapid deterioration because the wrapped protective materials are repeatedly heated and pressurized at high temperatures in the same portion. In the present invention, even if the continuous protective materials are re-used after use, the number of time thermal pressure is applied in the same portion becomes far less than that in the case of wrapping resin whose material is similar to that of the protective materials around the above-mentioned metal rolls because of the use of continuous protective materials, which leads to continuous production.

A laminate obtained by the present invention is obtained by thermally laminating a plurality of laminating materials including a thermally fusible laminating material, which is a heat resistant flexible circuit board for the uses of mainly an electronic and electric laminate.

EXAMPLES

The present invention will hereafter be described more particularly by showing examples thereof, but the present invention is not limited to these examples.

Glass transition temperatures (Tg) in Examples were measured under a nitrogen current at a temperature rising velocity of 10° C./min within the temperature range from room temperature to 400° C. using a DSC CELL SCC-41 produced by Shimadzu Corporation (Differential scanning calorimeter).

Example 1

A laminating material was prepared by superimposing electrolytic copper foils having a thickness of 18 μm on both sides of a thermoplastic polyimide film having a thickness of 25 μm whose Tg is 190° C. (PIXEO TP-T produced by KANEKA CORPORATION). In addition, 125 μm-polyimide films (Apical 125AH produced by KANEKA CORPORATION) were superimposed on both sides of the laminating material as protective films. The laminating material was thermally pressured (temperature: 260° C., processing rate: 0.5 m/min, linear pressure: 980 N/cm) by a thermal-press forming device 10 shown in FIG. 3 (b). And then the protective films were peeled off after cooling the laminating material bonded by thermal pressure and the protective films in closely contact with the laminating material to room temperature to prepare a flexible laminate.

As a result, a flexible laminate free from visual defects such as wrinkles was obtained.

Example 2

A flexible laminate was prepared in the same manner as in Example 1 except that rolled copper foils having a thickness of 18 μm which had more possibility of wrinkles were used instead of the electrolytic copper foils used in Example 1.

As a result, a flexible laminate free from visual defects such as wrinkles was obtained.

Example 3

A flexible laminate was prepared in the same manner as in Example 1 except that a double-belt press (temperature: 300° C., processing rate: 0.5 m/min, linear pressure: 980 N/cm) was used instead of the thermal-press forming device used in Example 1.

As a result, a flexible laminate free from visual defects such as wrinkles was obtained.

Example 4

Rolled copper foils similar to those used in Example 2 are superimposed on both sides of a thermoplastic polyimide film similar to that used in Example 1 and then a polyimide film similar to that in Example 1 was superimposed on the both sides of the thermoplastic polyimide film using a double-belt press (temperature: 300° C., processing rate: 0.5 m/min, linear pressure: 980 N/cm) to prepare a flexible laminate.

As a result, a flexible laminate free from visual defects such as wrinkles was obtained.

Example 5

A 25-μm three-layer structured adhesive film with a glass transition temperature of 190° C. containing thermoplastic polyimide resin component on both sides of a non-thermoplastic polyimide film (PIXEO BP produced by KANEKA CORPORATION) were prepared. And electrolytic copper foils having a thickness of 18 μm and a polyimide film having a thickness of 125 μm (Apical 125AH produced by KANEKA CORPORATION) are superimposed on the both sides of the non-thermoplastic polyimide film as a protective material. A flexible laminate was prepared by a heated roll laminating machine on condition that temperature is 260° C., linear pressure is 980 N/cm, processing speed is 0.5 m/min.

As a result, a flexible laminate free from visual defects such as wrinkles was obtained.

Example 6

A flexible laminate was prepared in the same manner as in Example 5 except that rolled copper foils having a thickness of 18 μm which had more possibility of wrinkles were used instead of the electrolytic copper foils used in Example 5.

As a result, a flexible laminate free from visual defects such as wrinkles was obtained.

Example 7

A flexible laminate was prepared in the same manner as in Example 5 except that the heated roll laminating machine operated at a temperature of 300° C. and processing rate of 2.0 m/min. As a result, a flexible laminate free from visual defects such as wrinkles was obtained.

Example 8

A flexible laminate was prepared in the same manner as in Example 6 except that the heated roll laminating machine operated at a temperature of 300° C. and processing rate of 2.0 m/min. As a result, a flexible laminate free from visual defects such as wrinkles was obtained.

Comparative Example 1

A flexible laminate was prepared in the same manner as in Example 1 except that a laminating material laminated by thermal pressure was cooled down to room temperature without the use of protective films.

As a result, wrinkles like longitudinal lines appeared in the direction of travel of laminating.

Comparative Example 2

A flexible laminate was prepared in the same manner as in Example 2 except that a laminating material laminated by thermal pressure was cooled down to roam temperature without the use of protective films.

As a result, wrinkles like longitudinal lines appeared in the direction of travel of laminating.

Comparative Example 3

A flexible laminate was prepared in the same manner as in Example 5 except that a laminating material laminated by thermal pressure was cooled down to room temperature without the use of protective films.

As a result, wrinkles like longitudinal lines appeared in the direction of travel of laminating.

Comparative Example 4

A flexible laminate was prepared in the same manner as in Example 6 except that a laminating material laminated by thermal pressure was cooled down to room temperature without the use of protective films.

As a result, wrinkles like longitudinal lines appeared in the direction of travel of laminating.

Comparative Example 5

A flexible laminate was prepared in the same manner as in Example 7 except that a laminating material laminated by thermal pressure was cooled down to room temperature without the use of protective films.

As a result, wrinkles like longitudinal lines appeared in the direction of travel of laminating.

Comparative Example 6

A flexible laminate was prepared in the same manner as in Example 8 except that a laminating material laminated by thermal pressure was cooled down to room temperature without the use of protective films.

As a result, wrinkles like longitudinal lines appeared in the direction of travel of laminating.

Example 9

With the use of a thermoplastic polyimide film similar to that used in Example 2 as an adhesive film, rolled copper foils having a thickness of 18 μm and protective materials similar to those used in Example 2 are superimposed on both sides of the thermoplastic polyimide film. Subsequently, thermal pressure was performed on condition that the temperature was 300° C., the linear pressure was 490 N/cm, processing rate was 2 m/min. At this time, a heat resistant flexible laminate was prepared under the other conditions as shown in Table 1. As a result, a flexible laminate free from visual defects such as wrinkles was obtained. The tensile modulus was measured by an autograph S-100-C produced by Shimadzu Corporation at a cross-head speed (tension speed) at 200 m/min in accordance with the JIS K713. In this specification, the coefficient of linear expansion was measured at a rate of temperature rise of 10° C./min using a thermal analysis device TMA8140 produced by Rigaku Corporation in accordance with the JIS K7197.

Example 10

A heat resistant flexible laminate was prepared in the same manner as in Example 9 except that a three-layer structured adhesive film (PIXEO BP produced by KANEKA CORPORATION) similar to the one used in Example 5 was used as an adhesive film. As a result, a flexible laminate free from visual defects such as wrinkles was obtained.

Comparative Example 7

A flexible laminate was prepared in the same manner as in Example 9 except for the conditions shown in Table 1.

As a result, wrinkles like longitudinal lines appeared in the direction of travel of laminating.

Comparative Example 8

A flexible laminate was prepared in the same manner as in Comparative Example 7 except that an adhesive film similar to the one used in Example 10 as an adhesive film was used.

As a result, wrinkles like longitudinal lines appeared in the direction of travel of laminating.

TABLE 1

|  | Example 9 & 10 | Comparative Example 7 & 8 |
|---|---|---|
| Protective Material | Polyimide film | None |
| Initial tensile modulus (n/mm²) at 300° C. | 1,176 | — |
| Coefficient of linear expansion (ppm/° C.) at 200° C. to 300° C. | 40 | — |

TABLE 1-continued

|  | Example 9 & 10 | Comparative Example 7 & 8 |
|---|---|---|
| Thickness (mm) | 75 | — |
| Recycle | Yes | — |
| Appearance | Free from Wrinkles | Wrinkling |

Example 11

With the use of a thermoplastic polyimide film similar to the one used in Example 2 as an adhesive film, rolled copper foils having a thickness of 18 μm and protective materials similar to those used in Example 2 are superimposed on both sides of the thermoplastic polyimide film. Subsequently, a heat resistant flexible laminate 6 was prepared by thermal pressure on condition that the temperature was 300° C., the linear pressure was 490 N/an, processing rate was 2 m/min using a thermal-press forming device as shown in FIG. 1 (*a*). At this time, a heat resistant flexible laminate was prepared.

As a result, a flexible laminate free from visual defects such as wrinkles was obtained.

Example 12

A heat resistant flexible laminate was prepared in the same manner as in Example 11 except that a three-layer structured adhesive film (PIXEO BP produced by KANEKA CORPORATION) similar to the one used in Example 5 was used as an adhesive film.

As a result, a flexible laminate free from visual defects such as wrinkles was obtained.

Example 13

A heat resistant flexible laminate was prepared in the same manner as in Example 11 except that a thermal-press forming device 10 shown in FIG. 1 (*b*) was used. As a result, a flexible laminate free from visual defects such as wrinkles and curls was obtained.

Example 14

A heat resistant flexible laminate was prepared in the same manner as in Example 13 except that a three-layer structured adhesive film (PIXEO BP produced by KANEKA CORPORATION) similar to the one used in Example 5 was used as an adhesive film.

As a result, a flexible laminate free from visual defects such as wrinkles and curls was obtained.

Example 15

With the use of a thermal-press forming device 10 shown in FIG. 3 (*a*), a heat resistant flexible laminate 6 was prepared by superimposing rolled copper foils having a thickness of 18 μm and a polyimide film (Apical 125AH produced by KANEKA CORPORATION) as protective films are superimposed on both sides of a 25 μm-thermoplastic polyimide film 2 having Tg of 190° C. (PIXEO TP-T produced by KANEKA CORPORATION) on condition that the temperature was 300° C., the linear pressure was 490 N/cm, processing rate was 2 m/min. At this time, contact time between the protective films to be used as protective materials and heated rolls 4 was 15 seconds. As a result, a flexible laminate free from visual defects such as wrinkles was obtained.

Example 16

A heat resistant flexible laminate was prepared in the same manner as in Example 15 except that a three-layer structured adhesive film (PIXEO BP produced by KANEKA CORPORATION) similar to the one used in Example 5 was used as an adhesive film.

As a result, a flexible laminate free from visual defects such as wrinkles and curls was obtained.

Example 17

A heat resistant flexible laminate 6 was prepared in the same manner as in Example 15 except that the contact time between the protective films and heated rolls 4 was 7.5 seconds using a thermal-press forming device shown in FIG. 3 (*b*). As a result, a flexible laminate free from visual defects such as wrinkles and curls was obtained.

Example 18

A heat resistant flexible laminate was prepared in the same manner as in Example 17 except that a three-layer adhesive film (PIXEO BP produced by KANEKA CORPORATION) similar to the one used in Example 5 was used as an adhesive film.

As a result, a flexible laminate free from visual defects such as wrinkles and curls was obtained.

Maximum height (Rmax), average roughness of 10 points (Rz), central line average roughness (Ra) of the surface roughness of copper foils shown in the following Examples 19 to 21 were abstracted from values listed in a catalog according to the definition of the JIS B0601. Micro void area ratio is a value represented by the area ratio, which was obtained by calculating the area of portions to be observed as non-adhesive portions by the observation of the thermoplastic polyimide layer using an optical microscope (Optiphoto: 100 times produced by NIKON CORPORATION) after entirely etching the copper foils superimposed on a sample laminate having a square of 100 mm with a ferric chloride solution.

Example 19 to Example 21

With the use of a 25-μm thermoplastic polyimide film having Tg of 190° C. as an adhesive film (PIXEO TP-T produced by KANEKA CORPORATION), copper foils having a thickness of 18 μm and polyimide films (Apical produced by KANEKA CORPORATION) to be used as protective materials were superimposed on both sides of the thermoplastic polyimide film. Subsequently, a laminate was obtained by lamination on condition that the temperature was 300° C., the linear pressure was 490 N/cm, the processing rate was 2 m/min using the thermal-press forming device 10 shown in FIG. 3(*b*). The detailed conditions are shown in Table 2. As a result, 10 μm to 50 μm-voids were not observed and no swelling of the surface of the copper foils was observed after a solder heat resistance test because the micro void ratio was 0%. The solder heat resistance test was performed as mentioned below. Namely, a sample prepared in accordance with the JIS C6471 was dried by heating at 150° C. for 30 minutes and then was prepared in a constant temperature room at 20° C. and 60% relative humidity (RH) to dip the sample in a bath of molted solder at 300° C. for 1 minute. Observations were conducted if there was swelling on one side and both sides of the copper foils of the sample. In water absorption condition, the sample made under the same condition was prepared with environmental testing equipment heating at 40° C. and 90% RH for 96 hours to observe if there is swelling on the one side and both sides of the copper foils of the sample dipped in a bath of molten solder at 260° C. for 10 seconds.

TABLE 2

| | | Examples 19 and 22 | Examples 20 and 23 | Examples 21 and 24 |
|---|---|---|---|---|
| Thermal-press forming device | | Heated roll laminating machine | Heated roll laminating machine | Double-belt Press |
| Kind of copper foil | | Rolling | Electrolysis | Rolling |
| Number of copper foil | | BHY (Japan Energy) | JTC (Japan Energy) | BHY (Japan Energy) |
| Copper foil surface | Rmax | 1.1 | 7 | 1.1 |
| | RZ | 0.9 | 6 | 0.9 |
| | Ra | 0.1 | 1.0 | 0.1 |
| Ratio of micro void (%) | | 0 | 0 | 0 |
| Solder heat resistance (C-96/40/90 | | No swelling | No swelling | No swelling |

Example 22

A laminate was prepared in the same manner as in Example 19 except that a three-layer structured adhesive film (PIXEO BP produced by KANEKA CORPORATION) similar to the one used in Example 5 was used as an adhesive film. As a result, 10 μm to 50 μm-voids were not observed and no swelling of the surface of copper foils was observed after a solder heat resistance test because the micro void ratio was 0%.

Example 23

A laminate was prepared in the same manner as in Example 20 except that a three-layer structured adhesive film (PIXEO BP produced by KANEKA CORPORATION) similar to the one used in Example 5 was used as an adhesive film. As a result, 10 μm to 50 μm-voids were not observed and no swelling of the surface of copper foils was observed after a solder heat resistance test because the micro void ratio was 0%.

Example 24

A laminate was prepared in the same manner as in Example 21 except that a three-layer structured adhesive film (PIXEO BP produced by KANEKA CORPORATION) similar to the one used in Example 5 was used as an adhesive film. As a result, 10 μm to 50 μm-voids were not observed and no swelling of the surface of copper foils was observed after a solder heat resistance test because the micro void ratio was 0%.

Example 25

A laminate was prepared in the same processing condition as in Example 19 except that copper foils having Rmax of 16 μm, Rz of 11 μm, and Ra of 2.2 μm were used. As a result, a flexible laminate free from visual defects such as wrinkles and curls was obtained, but the ratio of micro voids was not lower than 20%, so that swelling of the surface of the copper foils was observed after a solder heat resistance test.

Example 26 to Example 31

A 25-μm three-layer adhesive film with Tg of 190° C. containing thermoplastic polyimide resin component on both sides of a non-thermoplastic polyimide film (PIXEO BP KANEKA CORPORATION) was prepared. And rolled copper foils having a thickness of 18 μm and a polyimide film (Apical 125AH produced by KANEKA CORPORATION) were superimposed on the both sides of the non-thermoplastic polyimide film as protective materials. A flexible laminate was prepared by a thermal-press forming device in the same manner as in Example 1 on condition that the temperature is 300° C., the linear pressure is 490 N/cm, the processing speed is 2 m/min. Table 3 shows tension and rate of dimensional change of the films and copper foils at that time. The rate of dimensional change herein means the rate of dimensional change of the laminate when heating the laminate at 150° C. for 30 minutes and returning to room temperature relative to the obtained heat resistant flexible laminate after peeling off the copper foils from the laminate. A heat resistant flexible laminate was able to be prepared at the rate of dimensional change within the range of 0.10% of absolute value.

The rate of dimensional change was measured in conformance with the JIS C6471 (6.11 dimensional stability).

TABLE 3

| | Thermoplastic polyimide film | Copper foil | Rate of dimensional change (%) | |
|---|---|---|---|---|
| | tension N/mm$^2$ | tension N/mm$^2$ | MD | TD |
| Example 26 | 0.5 | 10 | −0.037 | +0.034 |
| Example 27 | 1.0 | 10 | −0.058 | +0.052 |
| Example 28 | 1.0 | 25 | −0.043 | +0.039 |
| Example 29 | 3.0 | 25 | −0.087 | +0.084 |
| Example 30 | 1.0 | 1.0 | −0.152 | +0.146 |
| Example 31 | 5.0 | 25 | −0.308 | +0.291 |

Example 32

In the embodiment shown in FIG. 1(a), a 25-μm three-layer structured adhesive film with a glass transition temperature of 190° C. containing a thermoplastic polyimide resin component on both sides of non-thermoplastic polyimide film was prepared as an adhesive film 2. Subsequently, the adhesive film and rolled copper foils 1 having a thickness of 18 μm were laminated on the condition that the temperature was 300° C., linear pressure was 490 N/cm, and processing rate was 2 m/min. As a result, a good sample free from wrinkles and nonuniformity in adhesion was obtained. The details of the conditions are shown in Table 4.

In this specification, the metal rolls were measured respectively on their circularity based on the JIS B0607, their cylindricity based on the JIS B0608, their surface roughness based on the JIS B601, and their shore hardness based on the JIS Z2246. Table 4 shows details of the conditions.

Example 33

Laminating was performed in the same manner as in Example 32 except for the use of metal rolls each having a roll diameter of 150 mm for a thermal-press forming device and the conditions shown in Table 4. As a result, laminating was possible, but wrinkles appeared on some portions of the sample surface which was never seen in Example 32. A good sample was obtained except wrinkles.

Example 34

Laminating was performed in the same manner as in Example 32 except for the use of metal rolls each having circularity of 0.07 mm, cylindricity of 0.08 mm, and surface roughness of 0.01 mm for the thermal-press forming device and the conditions shown in Table 4. As a result, there were partial nonuniformity in adhesion due to nonuniformity in pressure of the rolls, but a good sample was obtained except that point.

Example 35

Laminating was performed in the same manner as in Example 32 except for the use of metal rolls of the thermal-press forming device having temperature distribution accuracy of ±13° C. at 300° C. and the conditions shown in Table 4. As a result, crevices between metal rolls caused by thermal crown interrupted the ends of the sample from being pressurized, although the central portion was bonded, so that there were some unbonded portions on the ends of the sample which were not seen in Example 32. However, a good sample was obtained except that point.

Example 36

Laminating was performed in the same manner as in Example 32 except for the use of heated rolls having surface hardness (shore hardness) of Hs20 as metal rolls for the thermal-press forming device and the conditions shown in Table 4. As a result, minimal scars appeared on the roll surface due to adherence of waste metals, step difference caused by the crimp of the sample after performing the laminating for 50 hours in total. Since the portions having the scars were not pressurized, there was partially nonuniformity in bonding which was not seen on the sample in Example 32. A good sample was obtained except that point.

TABLE 4

| | | Example 32 | Example 33 | Example 34 | Example 35 | Example 36 |
|---|---|---|---|---|---|---|
| | Roll structure | Metal—Metal | Metal—Metal | Metal—Metal | Metal—Metal | Metal—Metal |
| | Roll diameter (mm) | 300 | 150 | 300 | 300 | 300 |
| ROLL | Circularity (mm) | 0.002 | 0.001 | 0.07 | 0.002 | 0.002 |
| | Cylindricity (mm) | 0.002 | 0.001 | 0.08 | 0.002 | 0.002 |
| | Surface roughness (mm) | 0.001 | 0.001 | 0.001 | 0.001 | 0.001 |
| | Temperature distribution accuracy (° C.) at 300 (° C.) | ±2 | ±2 | ±2 | ±13 | ±2 |

TABLE 4-continued

|  | Example 32 | Example 33 | Example 34 | Example 35 | Example 36 |
|---|---|---|---|---|---|
| Shore hardness | Hs70 | Hs70 | Hs70 | Hs70 | Hs20 |
| Results | A good sample free from non-uniformity was obtained. | Wrinkles partially appeared on the sample surface. | Non-uniformity in adhesion partially appeared due to nonuniformity in pressure. | There were unbonded portions on the ends of the sample. | Scars partially appeared on the roll surface after laminating for 50 hours in total. |

INDUSTRIAL APPLICABILITY

Recently, as electronic devices have been more and more downsized and reduced the weight, printed circuit boards, especially, flexible printed circuit boards constructed by the formation of a copper foil circuit on an insulating film have been demanded. The present invention enables to obtain a heat resistant laminate free from visual defects such as curls even when using rolled copper foils on which wrinkles easily appear at the time of lamination. Flexible printed circuit boards using such a flexible laminate of the present invention can be widely utilized in electronics devices to package high density packaging parts such as cell-phones and portable personal computers.

There have thus been shown and described a novel method for producing a laminate and a novel device for producing a laminate which fulfill all the objects and advantages therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention, which is to be limited only by the claims which follow.

What is claimed is:

1. A method of continuously forming a laminate by thermally laminating a plurality of laminating materials including a thermally fusible laminating material and a laminating material comprised of a metal, including the steps of:
   continuously assembling a plurality of layers of laminating material, including a thermally fusible laminating material and a laminating material comprised of a metal, into a continuous laminate;
   providing, as at least one of two outermost layers of said plurality of layers of laminating material, a layer of said laminating material comprised of a metal;
   preheating a protective material to a predetermined temperature and continuously arranging said protective material in contact with said layer of laminating material comprised of a metal;
   engaging said preheated protective material with the pressing surface of a thermal-press forming device to continuously bond said assembled layers of laminating material together into said laminate and adhere said protective material to said layer of laminating material comprised of a metal by thermal pressure at a temperature of not lower than 200° C., said predetermined preheating temperature being higher than said thermal pressure temperature;
   cooling the bonded laminating materials with the protective material adhering to said outermost layer whereby said adhered protective layer restrains said laminate form shrinking to the extent shrinking would occur if the bonded laminating material was not restrained in such a manner; and
   peeling off the protective material form the bonded laminating materials after said laminate has cooled.

2. A method of continuously forming a laminate by thermally laminating a plurality of laminating materials including a thermally fusible laminating material and a laminating material comprised of a metal, including the steps of:
   continuously assembling a plurality of layers of laminating material, including a thermally fusible laminating material and a laminating material comprised of a metal, into a continuous laminate;
   providing, as at least one of two outermost layers of said plurality of layers of laminating material, a layer of said laminating material comprised of a metal;
   continuously arranging a polyimide film protective material in contact with said layer of laminating material comprised of a metal;
   engaging said protective material with the pressing surface of a thermal-press forming device to continuously bond said assembled layers of laminating material together into said laminate and adhere said protective material to said layer of laminating material comprised of a metal by thermal pressure at a temperature of not lower than 200° C.;
   cooling the bonded laminating materials with the protective material adhering to said outermost layer whereby said adhered protective layer restrains said laminate form shrinking to the extent shrinking would occur if the bonded laminating material was not restrained in such a manner; and
   peeling off the protective material from the bonded laminating materials after said laminate has cooled.

3. The method according to claim 2, wherein the polyimide film is non-thermoplastic.

4. A method of continuously forming a laminate by thermally laminating a plurality of laminating materials including a thermally fusible laminating material and a laminating material comprised of a metal, including the steps of:
   continuously assembling a plurality of layers of laminating material, including a thermally fusible laminating material and a laminating material comprised of a metal, into a continuous laminate, said thermally fusible laminating material being a plural-layer film having a resin adhesive layer containing thermoplastic polyimide in an amount not smaller than 50% by weight on one side or both sides of a non-thermoplastic polyimide film;
   providing, as at least one of two outermost layers of said plurality of layers of laminating material, a layer of said laminating material comprised of a metal;

continuously arranging a protective material in contact with said layer of laminating material comprised of a metal;

engaging said protective material with the pressing surface of a thermal-press forming device to continuously bond said assembled layers of laminating material together into said laminate and adhere said protective material to said layer of laminating material comprised of a metal by thermal pressure at a temperature of not lower than 200° C.;

cooling the bonded laminating materials with the protective material adhering to said outermost layer whereby said adhered protective layer restrains said laminate from shrinking to the extent shrinking would occur if the bonded laminating material was not restrained in such a manner; and peeling off the protective material from the bonded laminating materials after said laminate has cooled.

* * * * *

UNITED STATES PATENT AND TRADEMARK OFFICE
CERTIFICATE OF CORRECTION

| | | |
|---|---|---|
| PATENT NO. | : 7,101,455 B1 | Page 1 of 1 |
| APPLICATION NO. | : 10/129037 | |
| DATED | : September 5, 2006 | |
| INVENTOR(S) | : Naoki Hase et al. | |

It is certified that error appears in the above-identified patent and that said Letters Patent is hereby corrected as shown below:

In the Claims

Column 26, in claim 2, line 26, before "shrinking to the extent" delete "form" and substitute --from-- in its place.

Signed and Sealed this

Twentieth Day of March, 2007

JON W. DUDAS
*Director of the United States Patent and Trademark Office*